(12) United States Patent
Matsushima et al.

(10) Patent No.: US 11,609,491 B2
(45) Date of Patent: Mar. 21, 2023

(54) REFLECTIVE MASK CLEANING APPARATUS AND REFLECTIVE MASK CLEANING METHOD

(71) Applicant: Shibaura Mechatronics Corporation, Yokohama (JP)

(72) Inventors: Daisuke Matsushima, Kanagawa (JP); Kensuke Demura, Kanagawa (JP); Masafumi Suzuki, Kanagawa (JP); Satoshi Nakamura, Kanagawa (JP)

(73) Assignee: SHIBAURA MECHATRONICS CORPORATION, Yokohama (JP)

( * ) Notice: Subject to any disclaimer, the term of this patent is extended or adjusted under 35 U.S.C. 154(b) by 469 days.

(21) Appl. No.: 16/715,044

(22) Filed: Dec. 16, 2019

(65) Prior Publication Data
US 2020/0124960 A1  Apr. 23, 2020

Related U.S. Application Data

(62) Division of application No. 15/124,409, filed as application No. PCT/JP2015/054578 on Feb. 19, 2015, now abandoned.

(30) Foreign Application Priority Data

Mar. 11, 2014  (JP) .................................. 2014-047319

(51) Int. Cl.
| G03F 1/24 | (2012.01) |
| G03F 1/82 | (2012.01) |
| B08B 7/00 | (2006.01) |

(52) U.S. Cl.
CPC .............. *G03F 1/82* (2013.01); *B08B 7/0035* (2013.01); *G03F 1/24* (2013.01)

(58) Field of Classification Search
None
See application file for complete search history.

(56) References Cited

U.S. PATENT DOCUMENTS

| 6,209,553 B1 | 4/2001 | Nagamura et al. |
| 2003/0045098 A1 | 3/2003 | Verhaverbeke et al. |

(Continued)

FOREIGN PATENT DOCUMENTS

| JP | 2001-203079 A | 7/2001 |
| JP | 2003-313594 A | 11/2003 |

(Continued)

OTHER PUBLICATIONS

International Search Report for PCT/JP2015/054578 dated Apr. 21, 2015.
Korean Office action for 10-2016-7027928 dated Aug. 10, 2017.

*Primary Examiner* — Mikhail Kornakov
*Assistant Examiner* — Ryan L Coleman
(74) *Attorney, Agent, or Firm* — Pearne & Gordon LLP

(57) ABSTRACT

A reflective mask cleaning apparatus according to an embodiment comprises a first supply section configured to supply a first solution containing at least one of an organic solvent and a surfactant to a ruthenium-containing capping layer provided in a reflective mask; and a second supply section configured to supply at least one of a reducing solution and an oxygen-free solution to the capping layer. A reflective mask cleaning apparatus according to an alternative embodiment comprises a third supply section configured to supply a plasma product produced from a reducing gas to a ruthenium-containing capping layer provided in a reflective mask; and a second supply section configured to supply at least one of a reducing solution and an oxygen-free solution to the capping layer.

4 Claims, 4 Drawing Sheets

(56) References Cited

U.S. PATENT DOCUMENTS

| | | | |
|---|---|---|---|
| 2006/0042651 A1 | 3/2006 | Verhaverbeke et al. | |
| 2008/0302391 A1 | 12/2008 | Sone | |
| 2012/0199980 A1* | 8/2012 | Pfuetzner | H01L 21/76844 |
| | | | 438/643 |
| 2012/0276474 A1 | 11/2012 | Yamauchi et al. | |
| 2013/0260292 A1 | 10/2013 | Yamazaki et al. | |

FOREIGN PATENT DOCUMENTS

| | | |
|---|---|---|
| JP | 2008-293699 A | 12/2008 |
| JP | 2010-109336 A | 5/2010 |
| JP | 2011-040653 A | 2/2011 |
| JP | 2011-162359 A | 8/2011 |
| JP | 2011-181657 A | 9/2011 |
| JP | 2011-197375 A | 10/2011 |
| JP | 2011-204864 A | 10/2011 |
| JP | 2011-228417 A | 11/2011 |
| JP | 2012-230253 A | 11/2012 |
| JP | 2013-137504 A | 7/2013 |
| JP | 2013-229537 A | 11/2013 |
| KR | 2008-0001023 A | 1/2008 |
| KR | 10-2012-0026915 A | 3/2012 |
| KR | 10-2013-0110050 A | 10/2013 |
| WO | 2013/152023 A1 | 10/2013 |

* cited by examiner

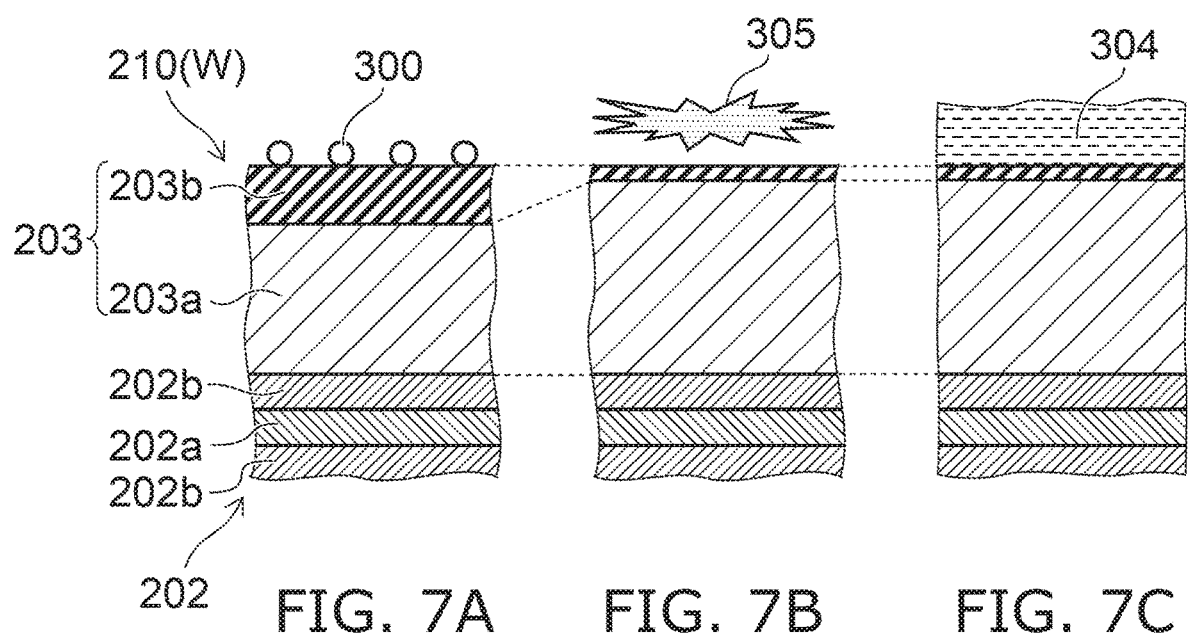

REFLECTIVE MASK CLEANING APPARATUS AND REFLECTIVE MASK CLEANING METHOD

This is a divisional of U.S. patent application Ser. No. 15/124,409 filed on Sep. 8, 2016, which claims priority from PCT/JP2015/054578 filed on Feb. 19, 2015, which claims priority from Japanese Patent Application No. 2014-047319 filed on Mar. 11, 2014. The contents of these applications are incorporated herein by reference in its entirety.

TECHNICAL FIELD

Embodiments of the invention relates to a reflective mask cleaning apparatus and a reflective mask cleaning method.

BACKGROUND ART

There is known a member including a layer containing an oxidizable material such as ruthenium (Ru).

For instance, a reflective mask is used in EUV lithography technique for transferring a fine pattern using extreme ultraviolet (EUV) radiation. The reflective mask includes a capping layer (also referred to as e.g. stopper layer) containing ruthenium.

In manufacturing this reflective mask, a reflection layer, a capping layer, and an absorption layer are sequentially formed on a major surface of a substrate. The absorption layer is dry etched to form a pattern region having a desired pattern. Then, the absorption layer, the capping layer, and the reflection layer are dry etched to form a light shielding region (also referred to as e.g. light shielding frame) surrounding the pattern region.

Here, a resist mask is used to dry etch the absorption layer. The resist mask is removed by cleaning with ozone water or a mixed solution of sulfuric acid and hydrogen peroxide water.

However, in the case where the capping layer is formed from ruthenium, such cleaning oxidizes ruthenium into ruthenium oxide.

The formation of ruthenium oxide causes the problem of decreasing the reflectance.

In the case where the reflective mask is used in the EUV lithography apparatus, a gas containing organic matter generated from the resist may reach the reflective mask. Thus, the organic matter may be attached to the reflective mask.

The organic matter attached to the reflective mask is also removed by cleaning with ozone water or a mixed solution of sulfuric acid and hydrogen peroxide water (see e.g. Patent Literature 1).

The reflective mask may be exposed to an oxygen-containing atmosphere during the processing in the cleaning step and the dry etching step described above, and the transport between the processing apparatuses.

Part of the ruthenium-containing capping layer is exposed from the absorption layer.

Thus, ruthenium oxide is formed in the exposed portion and decreases the reflectance. This causes the problem of degrading the optical characteristics of the reflective mask.

CITATION LIST

Patent Literature

[Patent Literature 1] JP 2011-181657 A

SUMMARY OF INVENTION

Technical Problem

The problem to be solved by the invention is to provide a reflective mask cleaning apparatus and a reflective mask cleaning method capable of suppressing the degradation of optical characteristics of the ruthenium-containing capping layer provided in the reflective mask.

Technical Solution

A reflective mask cleaning apparatus according to an embodiment comprises a first supply section configured to supply a first solution containing at least one of an organic solvent and a surfactant to a ruthenium-containing capping layer provided in a reflective mask; and a second supply section configured to supply at least one of a reducing solution and an oxygen-free solution to the capping layer.

A reflective mask cleaning apparatus according to an alternative embodiment comprises a third supply section configured to supply a plasma product produced from a reducing gas to a ruthenium-containing capping layer provided in a reflective mask; and a second supply section configured to supply at least one of a reducing solution and an oxygen-free solution to the capping layer.

Effect of the Invention

The embodiments of the invention provide a cleaning apparatus and a cleaning method capable of suppressing the degradation of optical characteristics of the ruthenium-containing capping layer provided in the reflective mask.

BRIEF DESCRIPTION OF DRAWINGS

FIGS. 7A to 7C are schematic process sectional views for illustrating the cleaning method performing dry cleaning using a reducing gas and wet cleaning using the second solution 304.

DESCRIPTION OF EMBODIMENTS

Figure 1:
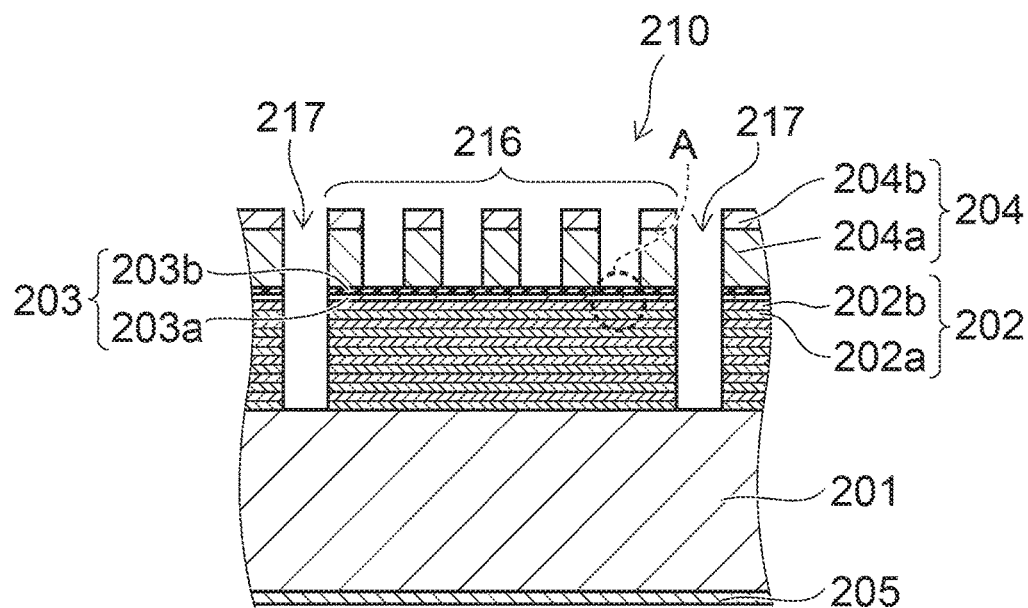
FIG. 1 is a schematic sectional view for illustrating a reflective mask 210 serving as a to-be-cleaned object W.

Embodiments will now be illustrated with reference to the drawings. In the drawings, similar components are labeled with like reference numerals, and the detailed description thereof is omitted appropriately.

The to-be-cleaned object W can be configured so that a layer containing an oxidizable material is exposed.

The to-be-cleaned object W can be e.g. a reflective mask including a ruthenium-containing capping layer or a substrate including a ruthenium-containing capping layer (a substrate under the process for manufacturing a reflective mask).

FIG. 1 is a schematic sectional view for illustrating a reflective mask 210 serving as a to-be-cleaned object W.

As shown in FIG. 1, on one major surface of a substrate 201, a reflection layer 202, a capping layer 203, and an absorption layer 204 are stacked in this order.

A conductive layer 205 is formed on the other major surface of the substrate 201.

The substrate 201 is formed from e.g. a low thermal expansion material (LTEM) or quartz.

The reflection layer 202 is formed by alternately stacking molybdenum (Mo) layers 202a and silicon (Si) layers 202b. For instance, the reflection layer 202 can be configured so that approximately 40-50 pairs of the molybdenum layer and the silicon layer are stacked.

The capping layer 203 contains ruthenium. In this case, the capping layer 203 can be configured so that a layer 203a made of ruthenium and a layer 203b made of ruthenium oxide are stacked.

The absorption layer 204 includes an absorber layer 204a and an antireflection layer 204b.

The absorber layer 204a contains e.g. a nitride of tantalum (such as tantalum boron nitride (TaBN) and tantalum nitride (TaN)) or a nitride of chromium (such as chromium nitride (CrN)).

The antireflection layer 204b contains e.g. an oxide of tantalum (such as tantalum boron oxide (TaBO) and tantalum oxide (TaO)) or an oxide of chromium (such as chromium oxide (CrOx)).

The conductive layer 205 contains e.g. chromium nitride.

A pattern to be transferred (such as circuit pattern) is formed in the pattern region 216.

The light shielding region 217 is formed so as to surround the pattern region 216.

As shown by part A in FIG. 1, the ruthenium-containing capping layer 203 is exposed in the pattern region 216.

Thus, by cleaning with ozone water or persulfuric acid, the exposed portion of the capping layer 203 may be oxidized into ruthenium oxide.

The to-be-cleaned object W may be exposed to an oxygen-containing atmosphere in e.g. the transport step at the time of dry etching. Thus, before cleaning, the exposed portion of the capping layer 203 may have been oxidized into ruthenium oxide.

The formation of ruthenium oxide causes the problem of decreasing the reflectance.

That is, this causes the problem of degrading the optical characteristics of the reflective mask 201.

Figure 2:
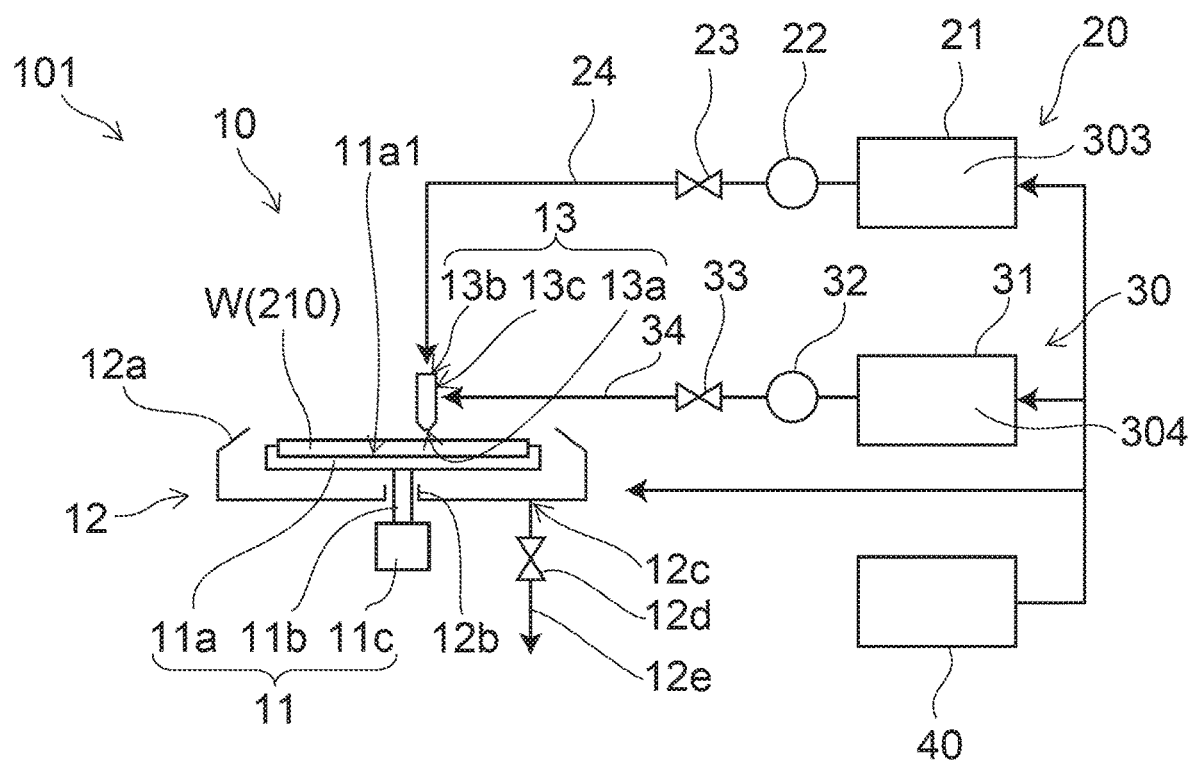
FIG. 2 is a schematic diagram for illustrating a cleaning apparatus 101 according to this embodiment.

FIG. 2 is a schematic diagram for illustrating a cleaning apparatus 101 according to this embodiment.

The cleaning apparatus 101 is a cleaning apparatus based on the single-wafer processing.

As shown in FIG. 2, the cleaning apparatus 101 is provided with a cleaning section 10, a first supply section 20, a second supply section 30, and a control section 40.

The cleaning section 10 is provided with a mounting section 11, a cover 12, and a nozzle 13.

The mounting section 11 is provided with a mounting stage 11a, a rotary shaft 11b, and a driving part 11c.

The mounting stage 11a is shaped like a plate.

A recess is provided in one major surface of the mounting stage 11a. The bottom surface of the recess constitutes a mounting surface 11a1 for mounting the to-be-cleaned object W.

Thus, housing the to-be-cleaned object W inside the recess of the mounting stage 11a enables mounting of the to-be-cleaned object W and mechanical holding of the to-be-cleaned object W.

In this case, the to-be-cleaned object W is mounted so that the layer containing an oxidizable material (e.g. ruthenium-containing capping layer 203) is directed to the nozzle 13 side.

The to-be-cleaned object W may be held by a vacuum chuck or electrostatic chuck, not shown, provided in the mounting stage 11a.

The rotary shaft 11b is shaped like a column.

One end part of the rotary shaft 11b is connected to the surface of the mounting stage 11a opposite from the mounting surface 11a1.

The rotary shaft 11b passes inside an insertion part 12b and extends to the outside of the cover 12.

The other end part of the rotary shaft 11b is connected to the driving part 11c outside the cover 12.

The driving part 11c can include a rotary device such as a motor.

The torque of the driving part 11c is transmitted through the rotary shaft 11b to the mounting stage 11a.

Thus, the mounting stage 11a, and the to-be-cleaned object W mounted on the mounting stage 11a, can be rotated by the driving part 11c.

The driving part 11c can be configured to be capable of changing the number of revolutions (rotation speed) as well as starting and stopping rotation. In this case, the driving part 11c can be configured to include a controllable motor such as a servomotor.

The cover 12 covers the periphery of the mounting stage 11a.

A first solution 303 and a second solution 304 are supplied to the to-be-cleaned object W, and ejected to the outside of the to-be-cleaned object W by rotation of the to-be-cleaned object W. The cover 12 receives the ejected first solution 303 and second solution 304, and attached matter 300 removed from the surface of the to-be-cleaned object W.

A bending part 12a bending toward the central direction is provided in the upper part of the sidewall of the cover 12. Providing the bending part 12a facilitates capturing the first solution 303 and the second solution 304 spattering above the to-be-cleaned object W, and the removed attached matter 300.

A tubular insertion part 12b projected into the cover 12 is provided in the central portion of the bottom surface of the cover 12.

The insertion part 12b is projected into the cover 12. This can suppress leakage of the first solution 303 and the second solution 304 from the portion where the rotary shaft 11b extends to the outside of the cover 12.

An ejection port 12c is provided in the bottom surface of the cover 12.

The ejection port 12c can be provided with an opening valve 12d.

Furthermore, a piping 12e can be connected to the opening valve 12d. Thus, the opening valve 12d can also be connected to e.g. a plant piping or a collection device, not shown, through the piping 12e.

In this case, a bevel inclined toward the ejection port 12c can be provided at the bottom surface of the cover 12. Providing such a bevel facilitates ejecting the first solution 303, the second solution 304, and the removed attached matter 300 flowing out to the bottom surface side of the cover 12.

Furthermore, a lifting device, not shown, can be provided to raise and lower the cover 12.

Providing a lifting device, not shown, for raising and lowering the cover 12 enables lowering the cover 12 to expose the mounting stage 11a from the cover 12 at the time of carrying in/out the to-be-cleaned object W.

This facilitates passing the to-be-cleaned object W from/to the mounting stage 11a.

The nozzle 13 has a discharge port 13a for discharging the first solution 303 and the second solution 304 toward the to-be-cleaned object W.

The nozzle 13 is provided so that the discharge port 13a is directed to the mounting surface 11a1 of the mounting stage 11a.

Furthermore, the nozzle 13 has a supply port 13b for supplying the first solution 303 and a supply port 13c for supplying the second solution 304.

The illustrated nozzle 13 has a supply port 13b and a supply port 13c. However, the nozzle 13 can be configured to have a single supply port for supplying the first solution 303 and the second solution 304.

Alternatively, a nozzle for discharging the first solution 303 and a nozzle for discharging the second solution 304 can be separately provided.

The nozzle 13 may be fixed at a prescribed position, or may be movably provided above the mounting stage 11a.

Here, the first solution 303 and the second solution 304 are sequentially discharged from the nozzle 13 toward the to-be-cleaned object W. This can remove attached matter 300 containing organic matter attached to the surface of the to-be-cleaned object W.

The details of the removal of attached matter will be described later (see FIGS. 5A to 5C).

The first supply section 20 is provided with a storage section 21, a solution supply section 22, a flow rate adjustment section 23, and a piping 24.

The storage section 21 stores the first solution 303.

The first solution 303 can be an alcohol such as isopropyl alcohol, an organic solvent such as acetone, or a surfactant.

The solution supply section 22 is connected to the storage section 21. The solution supply section 22 supplies the first solution 303 stored inside the storage section 21 toward the nozzle 13.

The solution supply section 22 can be e.g. a pump resistant to the first solution 303. The solution supply section 22 can be e.g. a chemical pump.

However, the solution supply section 22 is not limited to a pump. For instance, the solution supply section 22 can be configured to supply a gas into the storage section 21 for pneumatic feed of the first solution 303 stored inside the storage section 21.

The flow rate adjustment section 23 is connected to the solution supply section 22. The flow rate adjustment section 23 adjusts the flow rate of the first solution 303 supplied by the solution supply section 22. The flow rate adjustment section 23 can be e.g. a flow rate adjustment valve.

Furthermore, the flow rate adjustment section 23 can be configured to start and stop the supply of the first solution 303.

One end of the piping 24 is connected to the flow rate adjustment section 23. The other end of the piping 24 is connected to the supply port 13b of the nozzle 13.

The second supply section 30 is provided with a storage section 31, a solution supply section 32, a flow rate adjustment section 33, and a piping 34.

The storage section 31 stores the second solution 304.

The second solution 304 can be e.g. a reducing solution or an oxygen-free solution.

The reducing solution can be e.g. hydrogen-containing water. The hydrogen-containing water can be generated by e.g. adding hydrogen gas to ultrapure water.

The oxygen-free solution can be e.g. deoxygenated water.

The solution supply section 32 is connected to the storage section 31. The solution supply section 32 supplies the second solution 304 stored inside the storage section 31 toward the nozzle 13.

The solution supply section 32 can be e.g. a pump.

However, the solution supply section 32 is not limited to a pump. For instance, the solution supply section 32 can be configured to supply a gas into the storage section 31 for pneumatic feed of the second solution 304 stored inside the storage section 31.

The flow rate adjustment section 33 is connected to the solution supply section 32. The flow rate adjustment section 33 adjusts the flow rate of the second solution 304 supplied by the solution supply section 32. The flow rate adjustment section 33 can be e.g. a flow rate adjustment valve.

Furthermore, the flow rate adjustment section 33 can be configured to start and stop the supply of the second solution 304.

One end of the piping 34 is connected to the flow rate adjustment section 33. The other end of the piping 34 is connected to the supply port 13c of the nozzle 13.

The control section 40 controls the operation of the components provided in the cleaning apparatus 101.

For instance, the control section 40 controls the driving part 11c to control the starting and stopping of rotation and the number of revolutions (rotation speed) of the mounting stage 11a and the to-be-cleaned object W mounted on the mounting stage 11a.

The control section 40 controls the opening valve 12d to control the ejection of e.g. the first solution 303 and the second solution 304 from the cover 12.

The control section 40 controls the solution supply section 22 to control e.g. the starting and stopping of supply and the supply time of the first solution 303.

The control section 40 controls the flow rate adjustment section 23 to control the flow rate (supply amount) of the first solution 303.

The control section 40 controls the solution supply section 32 to control e.g. the starting and stopping of supply and the supply time of the second solution 304.

The control section 40 controls the flow rate adjustment section 33 to control the flow rate (supply amount) of the second solution 304.

Furthermore, an ultrasonic vibrator can be provided to apply ultrasonic vibration to at least one of the first solution 303 and the second solution 304.

For instance, the ultrasonic vibrator can be incorporated in e.g. the nozzle 13 or the mounting stage 11a.

Furthermore, a collection device can be provided to collect and reuse the first solution 303 and the second solution 304 ejected from the ejection port 12c of the cover 12.

Next, the operation of the cleaning apparatus 101 is illustrated.

First, the to-be-cleaned object W is mounted on the mounting surface 11a1 of the mounting stage 11a by a transport device, not shown.

At this time, the to-be-cleaned object W is mounted so that the surface with attached matter 300 is directed to the nozzle 13 side.

Next, the first solution 303 is discharged from the nozzle 13 by the first supply section 20. Thus, the first solution 303 is supplied to the surface of the to-be-cleaned object W.

At this time, the solution supply section 22 supplies the first solution 303 stored inside the storage section 21 toward the nozzle 13.

The flow rate adjustment section 23 adjusts the flow rate of the first solution 303 supplied by the solution supply section 22.

The supply time of the first solution 303 is controlled by the solution supply section 22 or the flow rate adjustment section 23.

The supply time of the first solution 303 can be determined by previous experiment or simulation.

The mounting stage 11a, and the to-be-cleaned object W mounted on the mounting stage 11a, are rotated by the driving part 11c at one of the times before starting the supply, during the supply, and after starting the supply of the first solution 303.

By rotating the to-be-cleaned object W, the supplied first solution 303 is spread throughout the surface of the to-be-cleaned object W. Furthermore, by rotating the to-be-cleaned object W, the first solution 303 supplied to the to-be-cleaned object W is ejected to the outside of the to-be-cleaned object W.

Attached matter 300 dissolved by the first solution 303 is also ejected to the outside of the to-be-cleaned object W.

The first solution 303 and the attached matter 300 ejected to the outside of the to-be-cleaned object W are received by the cover 12 and ejected from the ejection port 12c.

Next, the second solution 304 is discharged from the nozzle 13 by the second supply section 30. Thus, the second solution 304 is supplied to the surface of the to-be-cleaned object W from which the attached matter 300 has been removed.

At this time, the solution supply section 32 supplies the second solution 304 stored inside the storage section 31 toward the nozzle 13.

The flow rate adjustment section 33 adjusts the flow rate of the second solution 304 supplied by the solution supply section 32.

The supply time of the second solution 304 is controlled by the solution supply section 32 or the flow rate adjustment section 33.

The supply time of the second solution 304 can be determined by previous experiment or simulation.

The mounting stage 11a, and the to-be-cleaned object W mounted on the mounting stage 11a, are rotated by the driving part 11c at one of the times before starting the supply, during the supply, and after starting the supply of the second solution 304.

By rotating the to-be-cleaned object W, the supplied second solution 304 is spread throughout the surface of the to-be-cleaned object W. Furthermore, by rotating the to-be-cleaned object W, the second solution 304 and the residue of the attached matter 300 are ejected to the outside of the to-be-cleaned object W.

The second solution 304 and the residue of the attached matter 300 ejected to the outside of the to-be-cleaned object W are received by the cover 12 and ejected from the ejection port 12c.

The supply of the first solution 303 and the second solution 304 may be repeated by a prescribed number of times.

In the case of repeating the supply of the first solution 303 and the second solution 304, the supply may be stopped when a preset prescribed time has elapsed, or when the absence of the attached matter 300 is detected by a detection device, not shown.

Next, the to-be-cleaned object W is taken out of the mounting surface 11a1 of the mounting stage 11a and carried out to the outside of the cleaning apparatus 101 by the transport device, not shown.

The illustrated cleaning apparatus 101 is provided with the cleaning section 10, the first supply section 20, and the second supply section 30. However, it can be split into a cleaning apparatus provided with the cleaning section 10 and the first supply section 20 and a cleaning apparatus provided with the cleaning section 10 and the second supply section 30.

The cleaning apparatus provided with the cleaning section 10 and the first supply section 20 can be obtained by omitting the portions related to the second supply section 30 from the cleaning apparatus 101 illustrated in FIG. 2.

The cleaning apparatus provided with the cleaning section 10 and the second supply section 30 can be obtained by omitting the portions related to the first supply section 20 from the cleaning apparatus 101 illustrated in FIG. 2.

The foregoing has described the case where the cleaning apparatus 101 is a cleaning apparatus based on the single-wafer processing.

The cleaning apparatus can be a cleaning apparatus based on the batch processing.

For instance, the cleaning apparatus can be configured to include a bath storing the first solution 303, a bath storing the second solution 304, and a transport device for putting the to-be-cleaned object W into the bath storing the first solution 303 and the bath storing the second solution 304 and taking the to-be-cleaned object W out of the baths.

The cleaning apparatus provided with the cleaning section 10 and the first supply section 20 can be replaced by a dry cleaning apparatus 102 using a reducing gas such as ammonia gas ($NH_3$) and hydrogen ($H_2$).

That is, the cleaning apparatus can be configured to include the dry cleaning apparatus 102 using the reducing gas and the cleaning apparatus (wet cleaning apparatus) provided with the cleaning section 10 and the second supply section 30.

Figure 3:
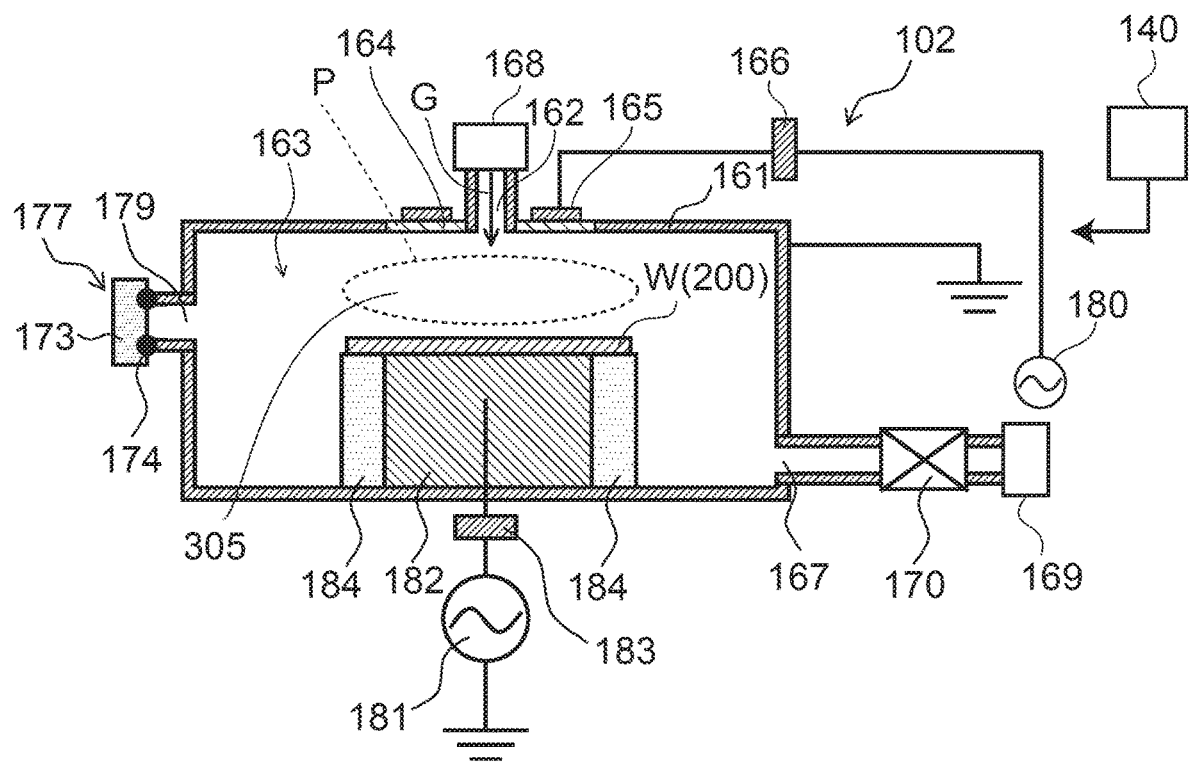
FIG. 3 is a schematic view for illustrating the dry cleaning apparatus 102.

FIG. 3 is a schematic view for illustrating the dry cleaning apparatus 102.

The dry cleaning apparatus 102 illustrated in FIG. 3 is a dual-frequency plasma processing apparatus.

As shown in FIG. 3, the dry cleaning apparatus 102 is provided with a cleaning chamber 161, a gate valve 177, a gas supply section 168, an evacuation section 169, and a control section 140.

The cleaning chamber 161 is formed from a conductive material such as aluminum. The cleaning chamber 161 can maintain a reduced-pressure atmosphere. A processing gas introduction port 162 for introducing a processing gas G is provided in the central portion of the ceiling of the cleaning chamber 161.

The processing gas G is supplied from the supply section 168 through the processing gas introduction port 162 into the cleaning chamber 161. When the processing gas G is supplied into the cleaning chamber 161, the flow rate, pressure and the like of the processing gas G are adjusted by an adjustment device incorporated in the gas supply section 168.

The processing gas G can be a reducing gas.

The reducing gas is e.g. ammonia gas, hydrogen gas, a mixed gas of ammonia gas and hydrogen gas, or a mixed gas of hydrogen gas and nitrogen gas. That is, the reducing gas only needs to be a gas containing ammonia or hydrogen. The reducing gas may be a gas containing only ammonia gas, a gas containing only hydrogen gas, or a mixed gas of nitrogen gas and at least one of ammonia gas and hydrogen gas.

A dielectric window 164 made of a dielectric material (such as quartz) is provided in the ceiling portion of the cleaning chamber 161 radially outside the processing gas introduction port 162. A coil 165 made of a conductor is provided on the surface of the dielectric window 164. One end of the coil 165 is grounded. The other end of the coil 165 is connected to a high-frequency power supply 180 through a matching device 166.

A space 163 for dry cleaning the to-be-cleaned object W is provided inside the cleaning chamber 161.

An electrode section 182 is provided below the space 163. A high-frequency power supply 181 is connected to the electrode section 182 through a matching device 183. The cleaning chamber 161 is grounded.

The dry cleaning apparatus 102 is a dual-frequency plasma processing apparatus having an inductively-coupled electrode at the top and a capacitively-coupled electrode at the bottom. That is, the electrode section 182 and the cleaning chamber 161 constitute a capacitively-coupled electrode. The coil 165 constitutes an inductively-coupled electrode.

The high-frequency power supply 181 can be configured to have a frequency of approximately 100 kHz to 100 MHz, and to apply a high-frequency power of approximately 0.15-1 kW to the electrode section 182.

The high-frequency power supply 180 can be configured to have a frequency of approximately 100 kHz to 100 MHz, and to apply a high-frequency power of approximately 1-5 kW to the coil 165.

The matching device 166, 183 includes a tuning circuit. The matching device 166, 183 can control the plasma P by controlling the reflection wave using the tuning circuit.

In the dry cleaning apparatus 102, the electrode section 182, the cleaning chamber 161, the high-frequency power supply 181, the high-frequency power supply 180, the coil 165, the gas supply section 168 and the like constitute a third supply section for supplying a plasma product produced from a reducing gas to the surface of the to-be-cleaned object W.

The third supply section plays a role similar to that of the aforementioned first supply section 20. That is, the third supply section removes attached matter 300 attached to the surface of the to-be-cleaned object W.

The electrode section 182 is covered with an insulation ring 184 at the periphery. The to-be-cleaned object W can be mounted on the electrode section 182. The electrode section 182 includes a holding mechanism (such as an electrostatic chuck) for holding the to-be-cleaned object W and a passing part (such as a lift pin) for passing the to-be-cleaned object W.

An evacuation port 167 is provided at the bottom of the cleaning chamber 161. The evacuation section 169 (e.g. vacuum pump) is connected to the evacuation port 167 through a pressure controller 170. The evacuation section 169 evacuates the cleaning chamber 161 to a prescribed pressure.

A carry-in/out port 179 for carrying in/out the to-be-cleaned object W is provided in the sidewall of the cleaning chamber 161. A gate valve 177 is provided so that the carry-in/out port 179 can be hermetically closed. The gate valve 177 has a gate 173 including a sealing member 174 such as an O-ring. The gate 173 is opened/closed by a gate opening mechanism, not shown. When the gate 173 is closed, the sealing member 174 is pressed to the wall surface of the carry-in/out port 179. Thus, the carry-in/out port 179 is hermetically closed.

The control section 140 controls the operation of each component provided in the dry cleaning apparatus 102.

For instance, the control section 140 controls the supply section 168 to supply the processing gas G into the cleaning chamber 161.

At this time, the control section 140 controls e.g. the flow rate and the pressure of the processing gas G by an adjustment device incorporated in the gas supply section 168.

The control section 140 controls the high-frequency power supply 180 to apply a high-frequency power to the coil 165.

At this time, the control section 140 controls the matching device 166 to control the plasma P.

The control section 140 controls the high-frequency power supply 181 to apply a high-frequency power to the electrode section 182.

At this time, the control section 140 controls the matching device 183 to control the plasma P.

The control section 140 controls the evacuation section 169 to evacuate the cleaning chamber 161.

At this time, the control section 140 controls the pressure controller 170 to control the internal pressure of the cleaning chamber 161.

The control section 140 controls the gate opening mechanism, not shown, to control the opening and closing of the gate 173.

Next, the operation of the dry cleaning apparatus 102 is illustrated.

First, the gate 173 of the gate valve 177 is opened by the gate opening mechanism, not shown.

By a transport device, not shown, the to-be-cleaned object W is carried from the carry-in/out port 179 into the cleaning chamber 161. The to-be-cleaned object W is mounted on the electrode section 182 and held by the holding mechanism incorporated in the electrode section 182.

The transport device, not shown, is retracted to the outside of the cleaning chamber 161.

Next, the gate 173 of the gate valve 177 is closed by the gate opening mechanism, not shown.

Subsequently, the cleaning chamber 161 is evacuated by the evacuation section 169.

Next, the processing gas G is supplied from the supply section 168 through the processing gas introduction port 162 into the space 163.

The processing gas G can be a reducing gas.

The reducing gas is e.g. ammonia gas, hydrogen gas, a mixed gas of ammonia gas and nitrogen gas, or a mixed gas of hydrogen gas and nitrogen gas.

Next, a high-frequency power having a frequency of approximately 100 kHz to 100 MHz is applied to the coil 165 by the high-frequency power supply 180. A high-frequency power having a frequency of approximately 100 kHz to 100 MHz is applied to the electrode section 182 by the high-frequency power supply 181. Preferably, the high-frequency powers applied by the high-frequency power supply 180 and the high-frequency power supply 181 are equal in frequency. For instance, the frequency of the high-frequency power applied by the high-frequency power supply 180 and the high-frequency power supply 181 can be set to 13.56 MHz.

The high-frequency power supply 180 can be configured to apply a high-frequency power of approximately 3 kW. The high-frequency power supply 181 can be configured to apply a high-frequency power of approximately 1 kW.

Then, the electrode section 182 and the cleaning chamber 161 constitute a capacitively-coupled electrode. Thus, electric discharge occurs between the electrode section 182 and the cleaning chamber 161. Furthermore, the coil 165 constitutes an inductively-coupled electrode. Thus, a high-frequency power is introduced from the coil 165 through the dielectric window 164 into the cleaning chamber 161. Accordingly, a plasma P is generated in the space 163 by the electric discharge occurring between the electrode section 182 and the cleaning chamber 161 and the high-frequency power introduced into the cleaning chamber 161. The generated plasma P excites and activates the processing gas G and produces a plasma product 305 such as neutral active species, ions, and electrons.

The produced plasma product 305 falls down in the space 163 to the surface of the to-be-cleaned object W and performs dry cleaning. The plasma P is controlled by controlling the reflection wave using the tuning circuit incorporated in the matching device 166, 183.

Next, the to-be-cleaned object W is taken out of the electrode section 182 and carried out to the outside of the dry cleaning apparatus 102 by the transport device, not shown.

Next, a cleaning method according to this embodiment is illustrated.

First, a cleaning method according to a comparative example is described.

Figures 4A, 4B, 4C:
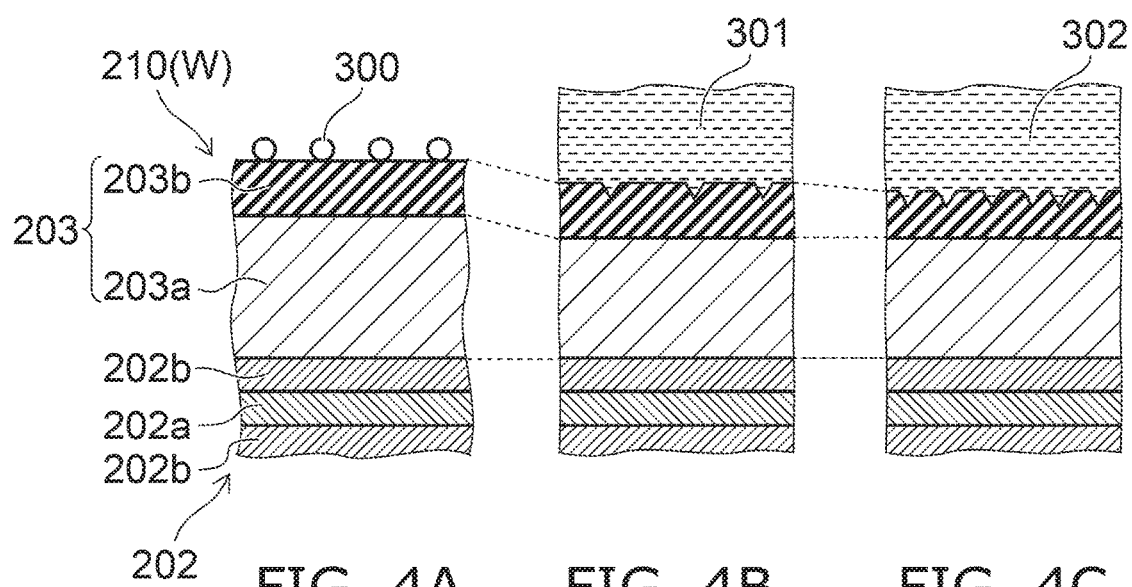
FIGS. 4A to 4C are schematic process sectional views for illustrating the cleaning method according to the comparative example.

FIGS. 4A to 4C are schematic process sectional views for illustrating the cleaning method according to the comparative example.

FIGS. 4A to 4C are enlarged views of part A in FIG. 1.

As shown in FIG. 4A, attached matter 300 containing organic matter may be attached to the surface of the reflective mask 210 (to-be-cleaned object W).

The attached matter 300 is e.g. residue of the resist mask used in dry etching the absorption layer 204, or organic matter attached to the reflective mask 210 in the light exposure step.

In the cleaning method according to the comparative example, the attached matter 300 is removed, i.e., cleaned, by the following procedure.

First, as shown in FIG. 4B, cleaning is performed by supplying a solution 301 containing an oxidizing substance such as ozone water and a mixed solution of sulfuric acid and hydrogen peroxide water (sulfuric acid peroxide mixture, SPM) to the surface of the reflective mask 210.

The attached matter 300 containing organic matter is dissolved by the solution 301 and removed from the surface of the reflective mask 210.

However, the layer 203*b* made of ruthenium oxide is exposed to the solution 301 and dissolved. Thus, depressions and the like are formed at the surface of the layer 203*b*.

Furthermore, the upper part of the layer 203*a* made of ruthenium is oxidized by the solution 301 and turned to a layer 203*b* made of ruthenium oxide.

In this case, the thickness of the originally formed layer 203*b* is decreased, but the thickness of the newly formed layer 203*b* is added.

The thickness of the layer 203*a* made of ruthenium is decreased by the amount of the newly formed layer 203*b*.

This increases the ratio of the layer 203*b* in the capping layer 203.

The reflectance is decreased by the increase of the ratio of the layer 203*b* and the formation of depressions and the like at the surface of the layer 203*b*.

That is, this may deteriorate the optical characteristics of the reflective mask 210.

Next, as shown in FIG. 4C, ammonia hydrogen peroxide water cleaning (SC1 cleaning) and hydrochloric acid hydrogen peroxide water cleaning (SC2 cleaning) may be further performed.

In the case of performing ammonia hydrogen peroxide water cleaning, a mixed solution of ammonia water, hydrogen peroxide water, and water is used as a solution 302 containing an oxidizing substance.

In the case of performing hydrochloric acid hydrogen peroxide water cleaning, a mixed solution of hydrochloric acid, hydrogen peroxide water, and water is used as a solution 302 containing an oxidizing substance.

Use of the solution 302 containing the oxidizing substance also changes the ratio of the layer 203*b* in the capping layer 203 and forms depressions and the like at the surface of the layer 203*b*.

As described above, when the to-be-cleaned object W including an exposed layer containing an oxidizable material is cleaned with a solution containing an oxidizing substance, the ratio of the layer containing the oxidizable material is changed, or depressions and the like are formed at the surface of the layer containing the oxidizable material.

This may degrade the optical characteristics of the reflective mask 210 (to-be-cleaned object W).

Next, a cleaning method according to this embodiment is illustrated.

Figures 5A, 5B, 5C:
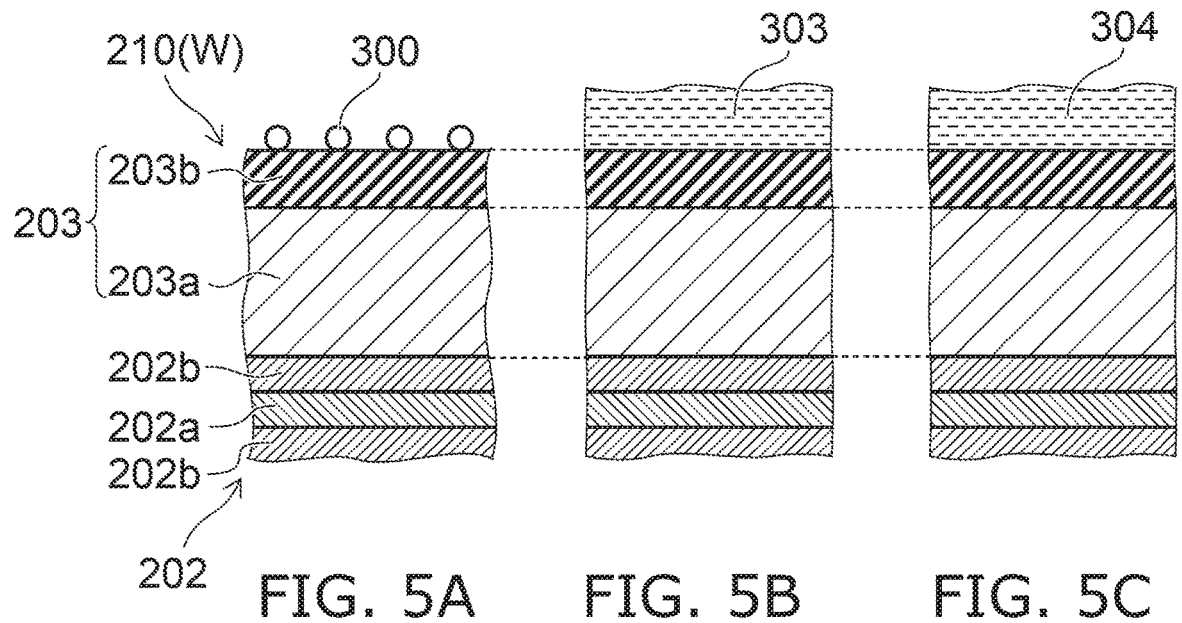
FIGS. 5A to 5C are schematic process sectional views for illustrating the cleaning method using the first solution 303 and the second solution 304.

FIGS. 5A to 5C are schematic process sectional views for illustrating the cleaning method using the first solution 303 and the second solution 304.

For instance, FIGS. 5A to 5C are schematic process sectional views for illustrating the cleaning method using the cleaning apparatus 101.

As shown in FIG. 5A, attached matter 300 containing organic matter may be attached to the surface of the reflective mask 210 (to-be-cleaned object W).

Thus, the attached matter 300 is removed, i.e., cleaned, by the following procedure.

First, as shown in FIG. 5B, the first solution 303 is supplied to the surface of the reflective mask 210 to remove the attached matter 300.

The attached matter 300 containing organic matter is dissolved by the first solution 303 and removed from the surface of the reflective mask 210.

The first solution 303 is an alcohol such as isopropyl alcohol, an organic solvent such as acetone, or a surfactant.

Thus, the attached matter 300 containing organic matter is dissolved. However, dissolution of the layer 203*b* made of ruthenium oxide and oxidation of the layer 203*a* made of ruthenium can be suppressed.

That is, in contrast to the case of using the solution 301, 302 containing an oxidizing substance, the increase of the ratio of the layer 203*b* and the formation of depressions and the like at the surface of the layer 203*b* can be suppressed.

Next, as shown in FIG. 5C, the second solution 304 is supplied to the surface of the reflective mask 210 to remove the first solution 303 and the residue of the attached matter 300 remaining on the surface of the reflective mask 210.

The first solution 303 and the residue of the attached matter 300 remaining on the surface of the reflective mask 210 are washed away by the second solution 304.

The second solution 304 is e.g. a reducing solution or an oxygen-free solution.

Thus, use of the second solution 304 can suppress dissolution of the layer 203*b* made of ruthenium oxide and oxidation of the layer 203*a* made of ruthenium.

That is, in contrast to the case of using the solution 301, 302 containing an oxidizing substance, use of the second solution 304 can suppress the increase of the ratio of the layer 203b and the formation of depressions and the like at the surface of the layer 203b.

Figure 6:
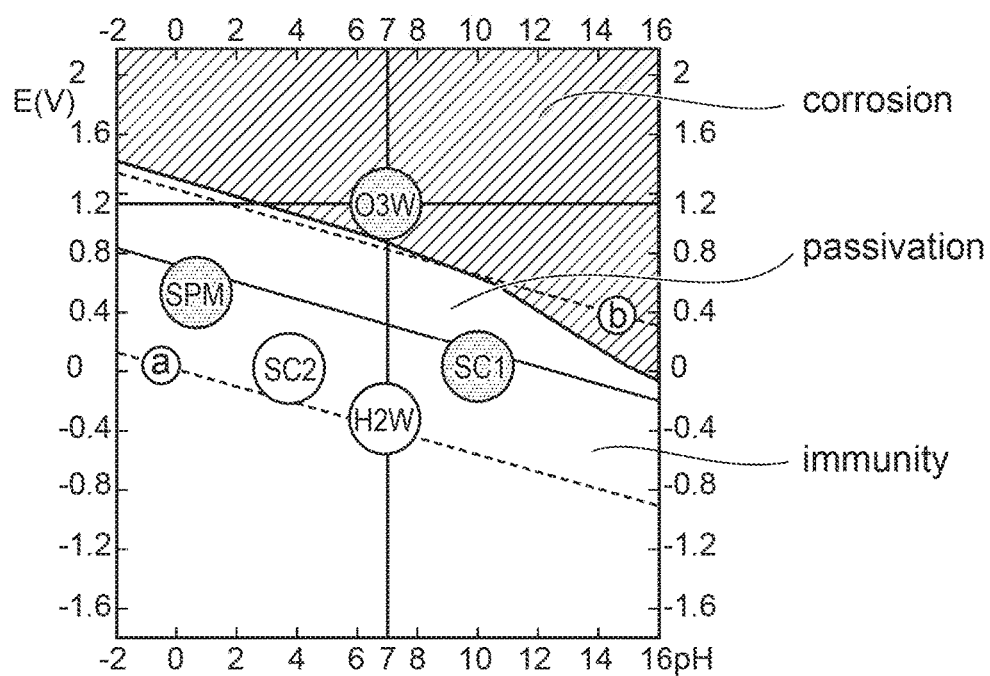
FIG. 6 is a potential-pH diagram (Pourbaix diagram) of ruthenium.

FIG. 6 is a potential-pH diagram (Pourbaix diagram) of ruthenium.

In FIG. 6, "O3W" represents ozone water. "SPM" represents a mixed solution of hydrogen peroxide water and sulfuric acid. "SC1" represents a mixed solution of ammonia water, hydrogen peroxide water, and water. "SC2" represents a mixed solution of hydrochloric acid, hydrogen peroxide water, and water.

"H2W" represents hydrogen-containing water.

In FIG. 6, dashed lines a, b represent the potential of two reactions related to production and decomposition of water. That is, the region between a and b represents a stable region of water.

In FIG. 6, the vertical axis represents the oxidation-reduction potential, ORP). The horizontal axis represents the hydrogen-ion concentration exponent.

FIG. 6 is divided into three regions of corrosion (the region with high corrosion rate of ruthenium), passivation (the region where oxide coating is produced on ruthenium), and immunity (the region where solid ruthenium is stable). Hydrogen-containing water belongs to the region of immunity, and has higher reducing performance than the other solutions.

As seen from FIG. 6, use of hydrogen-containing water, which is a reducing solution, can suppress dissolution and oxidation of the layer 203 made of ruthenium.

Ruthenium is an oxidizable material.

Thus, ruthenium oxide may be formed even in the case where the solution 301, 302 containing an oxidizing substance is not used.

In this case, use of a reducing solution such as hydrogen-containing water as the second solution 304 reduces part of ruthenium oxide into ruthenium.

That is, use of a reducing solution such as hydrogen-containing water as the second solution 304 can recover the layer 203 made of ruthenium.

In the case of a cleaning apparatus based on the batch processing, by a transport device, a plurality of reflective masks 210 (to-be-cleaned objects W) are put into a bath storing the first solution 303 to remove attached matter 300 attached to the surface of the to-be-cleaned objects W.

Then, by the transport device, the plurality of reflective masks 210 (to-be-cleaned objects W) are taken out of the bath storing the first solution 303. The plurality of to-be-cleaned objects W are put into a bath storing the second solution 304.

The first solution 303 and the residue of the attached matter 300 remaining on the surface of the plurality of to-be-cleaned objects W are removed by putting the plurality of reflective masks 210 (to-be-cleaned objects W) into the bath storing the second solution 304.

The cleaning method according to this embodiment can suppress the increase of the ratio of the layer 203b and the formation of depressions and the like at the surface of the layer 203b.

That is, the cleaning method according to this embodiment can suppress the degradation of optical characteristics of the ruthenium-containing capping layer provided in the reflective mask.

Next, a cleaning method according to an alternative embodiment is illustrated.

FIGS. 7A to 7C are schematic process sectional views for illustrating the cleaning method performing dry cleaning using a reducing gas and wet cleaning using the second solution 304.

For instance, FIGS. 7A to 7C are schematic process sectional views for illustrating the cleaning method using the dry cleaning apparatus 102 and a cleaning apparatus provided with at least the cleaning section 10 and the second supply section 30 (e.g. an apparatus obtained by omitting the portions related to the first supply section 20 from the cleaning apparatus 101 illustrated in FIG. 2).

As shown in FIG. 7A, attached matter 300 containing organic matter may be attached to the surface of the reflective mask 210 (to-be-cleaned object W).

Thus, the attached matter 300 is removed, i.e., cleaned, by the following procedure.

First, as shown in FIG. 7B, the reducing gas (processing gas G) is excited and activated by the plasma P to produce a plasma product 305.

Then, the plasma product 305 is supplied to the surface of the reflective mask 210 to decompose away the attached matter 300.

The plasma product 305 is produced from the reducing gas. Thus, the plasma product 305 has reducing performance.

Accordingly, part of the layer 203b made of ruthenium oxide is reduced.

More specifically, no depression is formed at the surface of the layer 203b. Furthermore, the thickness of the layer 203b is decreased, and the thickness of the layer 203a made of ruthenium is increased.

That is, the ratio of the layer 203b in the capping layer 203 is decreased.

In this case, the decrease of the ratio of the layer 203b in the capping layer 203 causes the increase of reflectance.

This can improve the optical characteristics of the reflective mask 210.

Next, as shown in FIG. 7C, the second solution 304 is supplied to the surface of the reflective mask 210 to remove particles generated by the cleaning shown in FIG. 7B and the residue of the attached matter 300 remaining on the surface of the reflective mask 210.

Cleaning by the second solution 304 can be made similar to that illustrated in FIG. 5C, and the detailed description thereof is omitted.

The embodiments have been illustrated above. However, the invention is not limited to the above description.

Those skilled in the art can appropriately modify the above embodiments by addition, deletion, or design change of components, or by addition, omission, or condition change of steps. Such modifications are also encompassed within the scope of the invention as long as they include the features of the invention.

For instance, the shape, dimension, material, arrangement and the like of the components provided in the cleaning apparatus 101 and the dry cleaning apparatus 102 are not limited to those illustrated, but can be appropriately changed. For instance, the cleaning apparatus 101 is not limited to the rotary apparatus, but may perform cleaning using ultrasonic vibration. For instance, the dry cleaning apparatus 102 is not limited to the dual-frequency plasma processing apparatus. The dry cleaning apparatus 102 can be appropriately changed to e.g. a remote plasma processing apparatus, surface-wave plasma (SWP) processing apparatus, capacitively-coupled plasma (CCP) processing apparatus, or inductively-coupled plasma (ICP) processing apparatus.

For instance, the surface to which the attached matter 300 is attached may be on the opposite side (back surface of the to-be-cleaned object W) from the surface on which the pattern region 216 is formed. In this case, the to-be-cleaned object W can be mounted on the mounting stage 11a of the cleaning section 10 so that the back surface is directed to the nozzle 13 side.

REFERENCE SIGNS LIST

10 cleaning section
11 mounting section
12 cover
13 nozzle
20 first supply section
21 storage section
22 solution supply section
23 flow rate adjustment section
30 second supply section
31 storage section
32 solution supply section
33 flow rate adjustment section
40 control section
101 cleaning apparatus
102 dry cleaning apparatus
140 control section
161 cleaning chamber
168 gas supply section
169 evacuation section
210 reflective mask
203 capping layer
203a layer made of ruthenium
203b layer made of ruthenium oxide
300 attached matter
303 first solution
304 second solution
G processing gas
W to-be-cleaned object

The invention claimed is:

1. A reflective mask cleaning method comprising:
supplying a plasma product produced from a reducing gas to a ruthenium-containing capping layer provided in a reflective mask, the ruthenium-containing capping layer comprising a ruthenium oxide-containing layer, the ruthenium oxide-containing layer being exposed on a surface of the reflective mask, attached matter containing organic matter attaching to the to the ruthenium oxide-containing layer being removed by the plasma product produced from the reducing gas, and a part of the ruthenium oxide-containing layer being reduced by the plasma product produced from the reducing gas; and supplying at least one of a reducing solution and an oxygen-free solution to the ruthenium-containing capping layer, residue of the attached matter on the ruthenium oxide-containing layer being removed by the at least one of the reducing solution and the oxygen-free solution.

2. The method according to claim 1, wherein the reflective mask includes a pattern region and a light shielding region provided so as to surround the pattern region, and the capping layer is exposed in the pattern region.

3. The method according to claim 1, wherein the reducing solution comprises hydrogen-containing water, and the oxygen-free solution comprises deoxygenated water.

4. The method according to claim 1, wherein the reducing gas is a gas containing ammonia or hydrogen.

* * * * *

UNITED STATES PATENT AND TRADEMARK OFFICE
CERTIFICATE OF CORRECTION

PATENT NO. : 11,609,491 B2
APPLICATION NO. : 16/715044
DATED : March 21, 2023
INVENTOR(S) : Daisuke Matsushima et al.

It is certified that error appears in the above-identified patent and that said Letters Patent is hereby corrected as shown below:

In the Claims

Column 16, Line 13, "attaching to the to the ruthenium" should be --attaching to the ruthenium--

Signed and Sealed this
Seventh Day of November, 2023

Katherine Kelly Vidal
*Director of the United States Patent and Trademark Office*